(12) United States Patent
Wu et al.

(10) Patent No.: US 11,917,772 B2
(45) Date of Patent: Feb. 27, 2024

(54) POWER SUPPLY WITH SEPARABLE COMMUNICATION MODULE

(71) Applicant: COTEK ELECTRONIC IND. CO., LTD., Taoyuan (TW)

(72) Inventors: Chun-Wei Wu, Taoyuan (TW);
Ta-Chang Wei, Taoyuan (TW);
Chung-Liang Tsai, Taoyuan (TW);
Shou-Cheng Yeh, Taoyuan (TW)

(73) Assignee: COTEK ELECTRONIC IND. CO., LTD., Taoyuan (TW)

( * ) Notice: Subject to any disclaimer, the term of this patent is extended or adjusted under 35 U.S.C. 154(b) by 0 days.

(21) Appl. No.: 17/542,799

(22) Filed: Dec. 6, 2021

(65) Prior Publication Data
US 2023/0180401 A1 Jun. 8, 2023

(51) Int. Cl.
*H05K 5/00* (2006.01)
*H05K 1/14* (2006.01)

(52) U.S. Cl.
CPC ........... *H05K 5/0069* (2013.01); *H05K 1/144* (2013.01)

(58) Field of Classification Search
CPC .... G06F 1/266; H01R 13/6675; H02J 7/0042; H05K 5/0069; H05K 1/144
See application file for complete search history.

(56) References Cited

U.S. PATENT DOCUMENTS

| | | | |
|---|---|---|---|
| 8,174,835 B2* | 5/2012 | Kim | G06F 1/185 361/756 |
| 9,236,699 B2* | 1/2016 | Lai | H01R 13/665 |
| 9,793,729 B2* | 10/2017 | Hsia | H02J 7/342 |

* cited by examiner

*Primary Examiner* — James Wu
(74) *Attorney, Agent, or Firm* — Muncy, Geissler, Olds & Lowe, P.C.

(57) ABSTRACT

A power supply with a separable communication module includes a casing with a port; a main board placed in the casing and having a power conversion circuit; a sub-board electrically connected to the power conversion circuit and provided with at least one first connector; and a communication module. The power conversion circuit has at least one electrical connection terminal. A first interface of the first connector faces the port. The communication module includes a first circuit board and a communication circuit disposed on the first circuit board, the first circuit board has an electrical connection part electrically connected to the communication circuit, the electrical connection part has a first state of connecting with the first interface, and a second state of detaching from the first interface.

13 Claims, 8 Drawing Sheets

POWER SUPPLY WITH SEPARABLE COMMUNICATION MODULE

FIELD OF THE INVENTION

The invention relates to a power supply, and more particularly to a power supply with which a user is capable of replacing a communication module by oneself.

BACKGROUND OF THE INVENTION

With the development of technology, the current power supply has a wide range of applications, and users have to select the corresponding output interface based on their own needs. However, the output interface type of the commercially available power supply is fixed, and a single power supply can only be equipped with a single type of interface; as a result, users can only use the communication type of the output interface on the power supply with a corresponding external connector. Since the output interface of the power supply cannot be changed according to a user's own needs, the user has to rely on external connectors for switching, which is inconvenient.

In addition, the communication interface in the existing power supply adopts a fixed design, in case the communication interface is damaged, the user will be unable to replace the communication interface, and must send the entire power supply back to the original manufacturer for repair.

On the other hand, the existing power supply pursues the characteristic of small size, but there are many electronic components inside the power supply; therefore, physical wires are usually used for connecting the output interface with the power supply main board. However, physical wires occupy the internal space of the power supply during assembly, in case locations for arranging the wires are not properly laid out, it is easy to cause poor heat dissipation inside the power supply. According to this, although the existing communication interface can be vertically installed on the main board in the form of an adapter card and electrically connected with the main board, the conventional communication interface card still cannot be replaced by the user.

SUMMARY OF THE INVENTION

A main object of the invention is to solve the problem that the communication interface equipped in the conventional power supply cannot be replaced by users.

In order to achieve the above object, the invention provides a power supply comprising a casing, a main board, a sub-board and a communication module. The casing comprises a port, the main board is disposed in the casing and provided with a power conversion circuit, and the power conversion circuit comprising at least one electrical connection terminal. The sub-board is disposed on the main board and electrically connected to the power conversion circuit, the sub-board is provided with at least one first connector, and a first interface of the first connector directly faces the port. The communication module serves as a main part of the power supply to exchange information with at least one external electronic device, the communication module comprises a first circuit board and a communication circuit disposed on the first circuit board, the communication circuit comprises a second connector for forming an electrical connection with the external electronic device, the first circuit board comprises an electrical connection part electrically connected to the communication circuit, the electrical connection part comprises a first state of connecting with the first interface so that the communication module is electrically connected to the power conversion circuit via the sub-board, and a second state of detaching from the first interface so that the communication module is separated from the sub-board and electrically disconnected with the sub-board.

In one embodiment, the sub-board comprises a second circuit board for disposing the first connector and electrically connected with the main board, and a socket assembled with the second circuit board for positioning the communication module.

In one embodiment, the main board comprises at least one assembling hole located at a projection position of the socket, and the socket comprises at least one positioning protrusion assembled with the assembling hole.

In one embodiment, the positioning protrusion comprises an upright portion and a hook portion connected to the upright portion.

In one embodiment, the socket defines an assembly path for the communication module to be directly plugged into the first connector.

In one embodiment, the socket comprises two side walls disposed in parallel, and two position limiting rails located on the two side walls respectively.

In one embodiment, the socket comprises two side walls disposed in parallel, and one of the two side walls is formed with a gap at a side close to the port for inserting a positioning plate of the communication module.

In one embodiment, the electrical connection part is a plurality of conductive terminals.

In one embodiment, a specification of the second connector is selected from a group consisting of RS-232, RS-422, RS-485, CAN bus, Ethernet, LIN bus, $I^2C$, and USB.

In one embodiment, the communication module comprises a covering plate connected to the first circuit board and disposed at the port, and the covering plate is formed with an opening exposed on a surface and communicated to a second interface of the second connector.

In one embodiment, the covering plate comprises a positioning plate connected to the sub-board for positioning an assembly position of the communication module.

In one embodiment, the main board comprises a third connector electrically connected to the power conversion circuit, and the sub-board comprises a fourth connector connected to the third connector.

Through the foregoing implementation of the invention, compared with the prior art, the invention has the following features: the power supply of the invention comprises the sub-board, and the sub-board is provided with the first connector, when the communication module is inserted, the electrical connection part is connected with the first interface, thereby generating an electrical connection relationship with the main board via the sub-board. When a user intends to take out the communication module, the electrical connection part is detached from the first interface, and the communication module is completely separated from the sub-board, thereby the communication module of the power supply of the invention can be replaced by the user according to requirements.

DETAILED DESCRIPTION OF THE PREFERRED EMBODIMENTS

Figure 1:
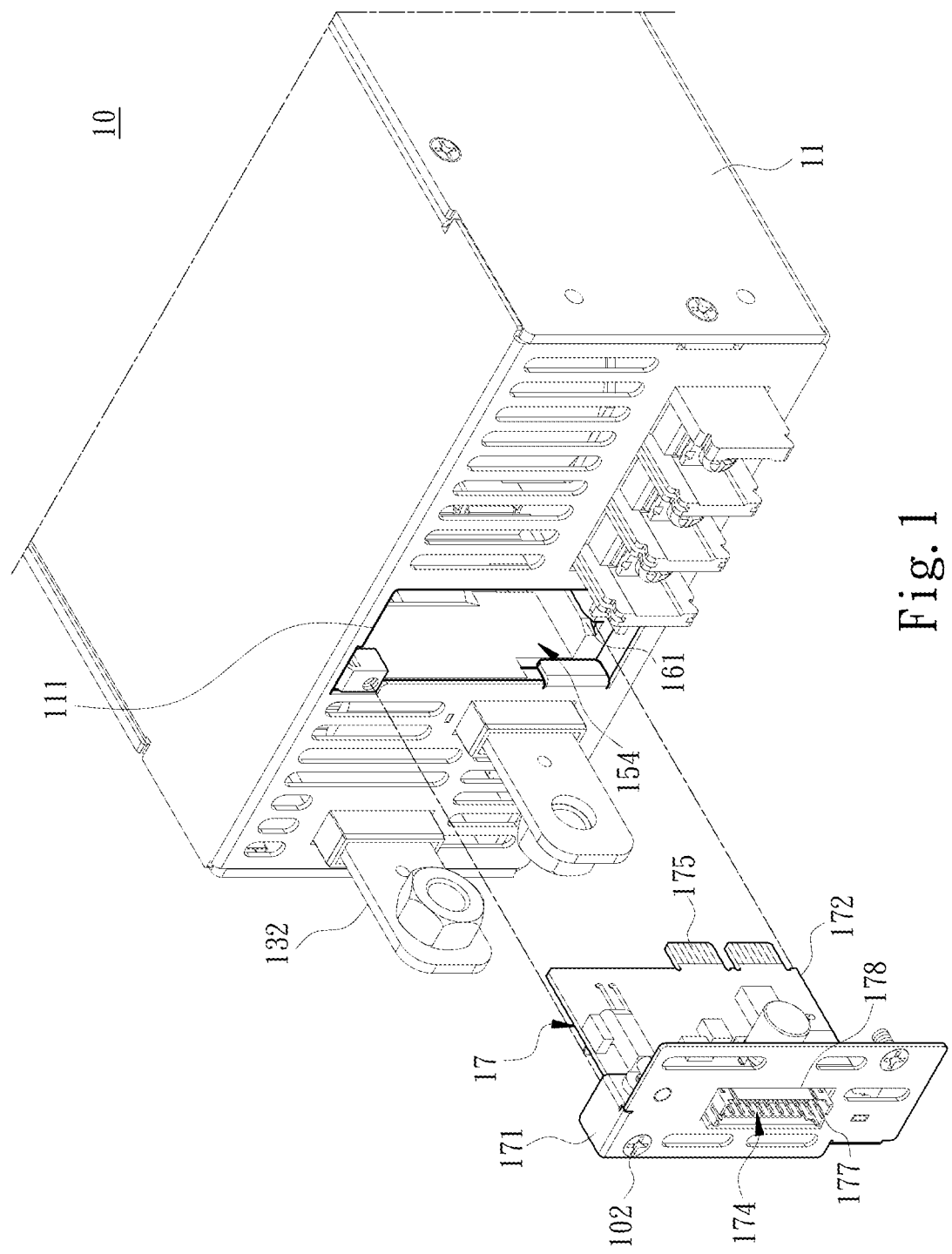
FIG. 1 is a perspective structural view of an embodiment of the invention.
Figure 2:
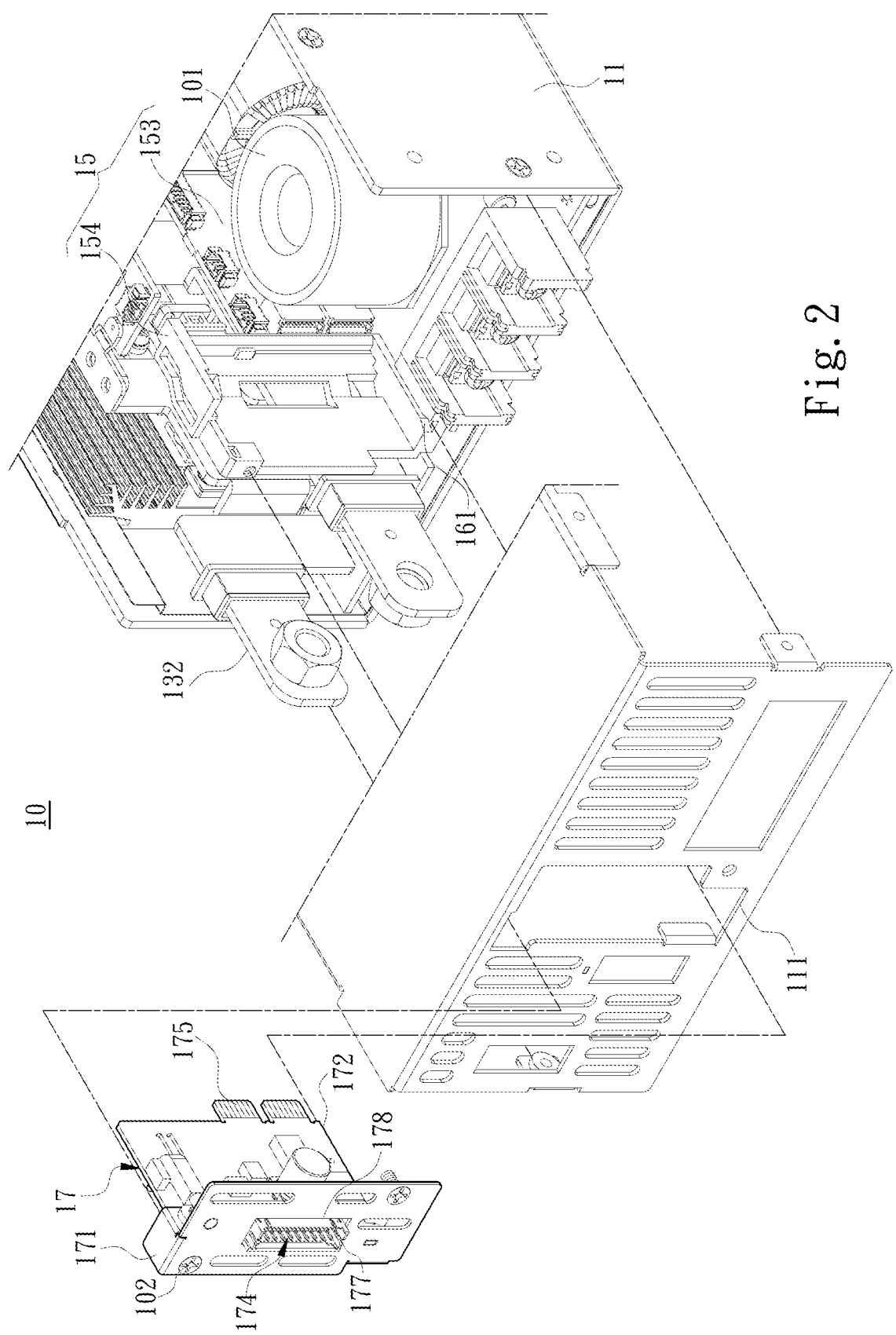
FIG. 2 is an exploded structural view of an embodiment of the invention.
Figure 3:
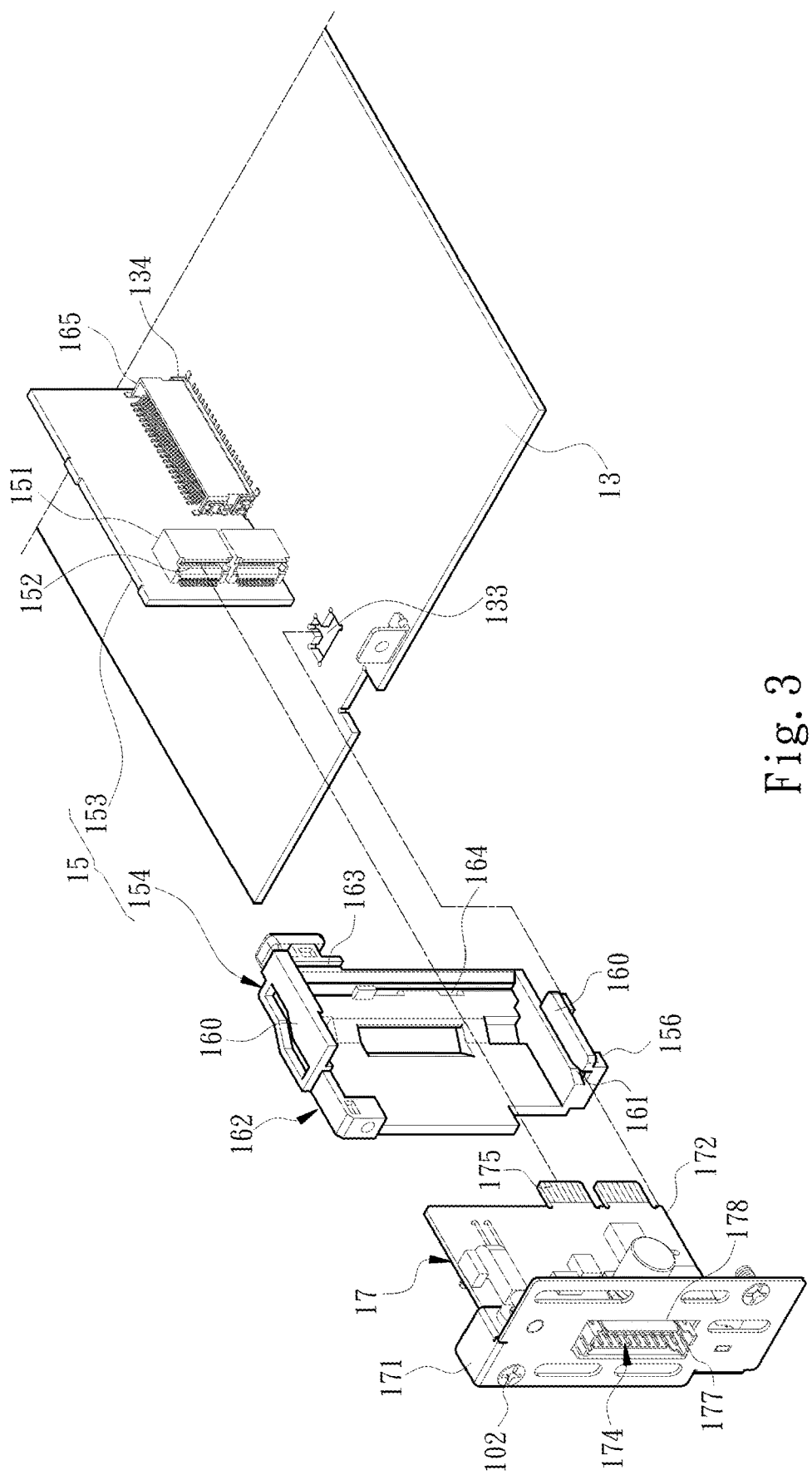
FIG. 3 is a first exploded structural view of partial components of an embodiment of the invention.
Figure 4:
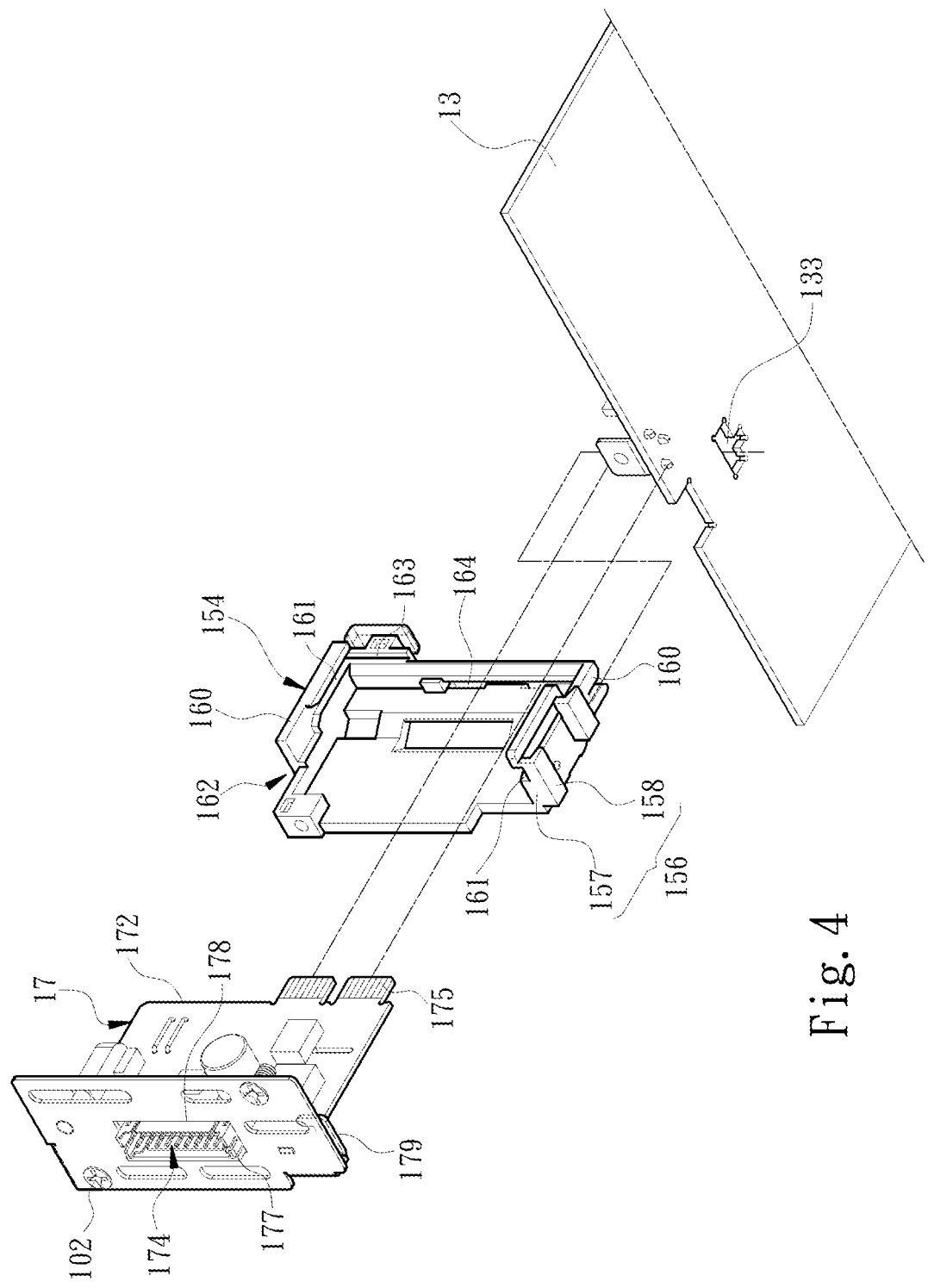
FIG. 4 is a second exploded structural view of partial components of an embodiment of the invention.
Figure 5:
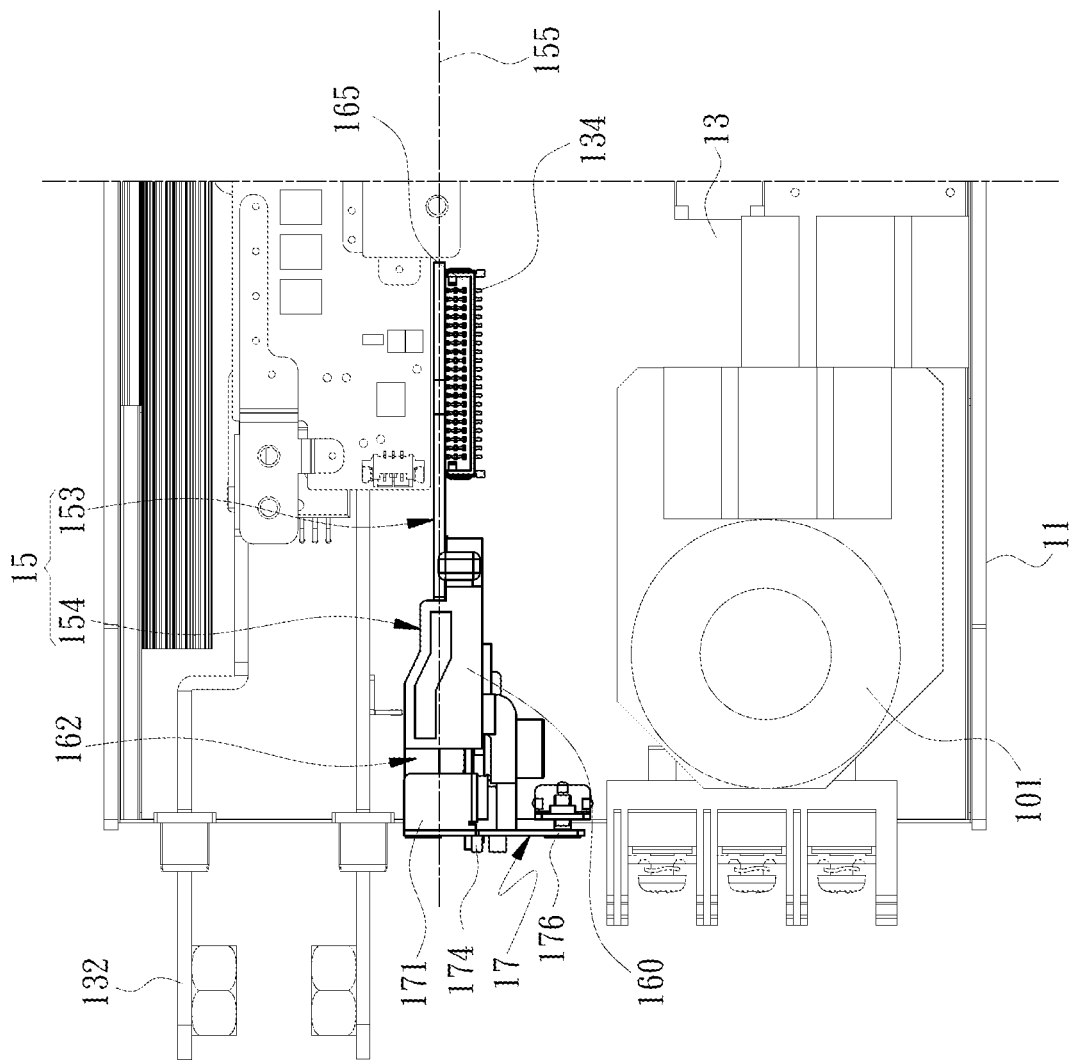
FIG. 5 is a first top view of a cross-sectional structure of an embodiment of the invention.
Figure 6:
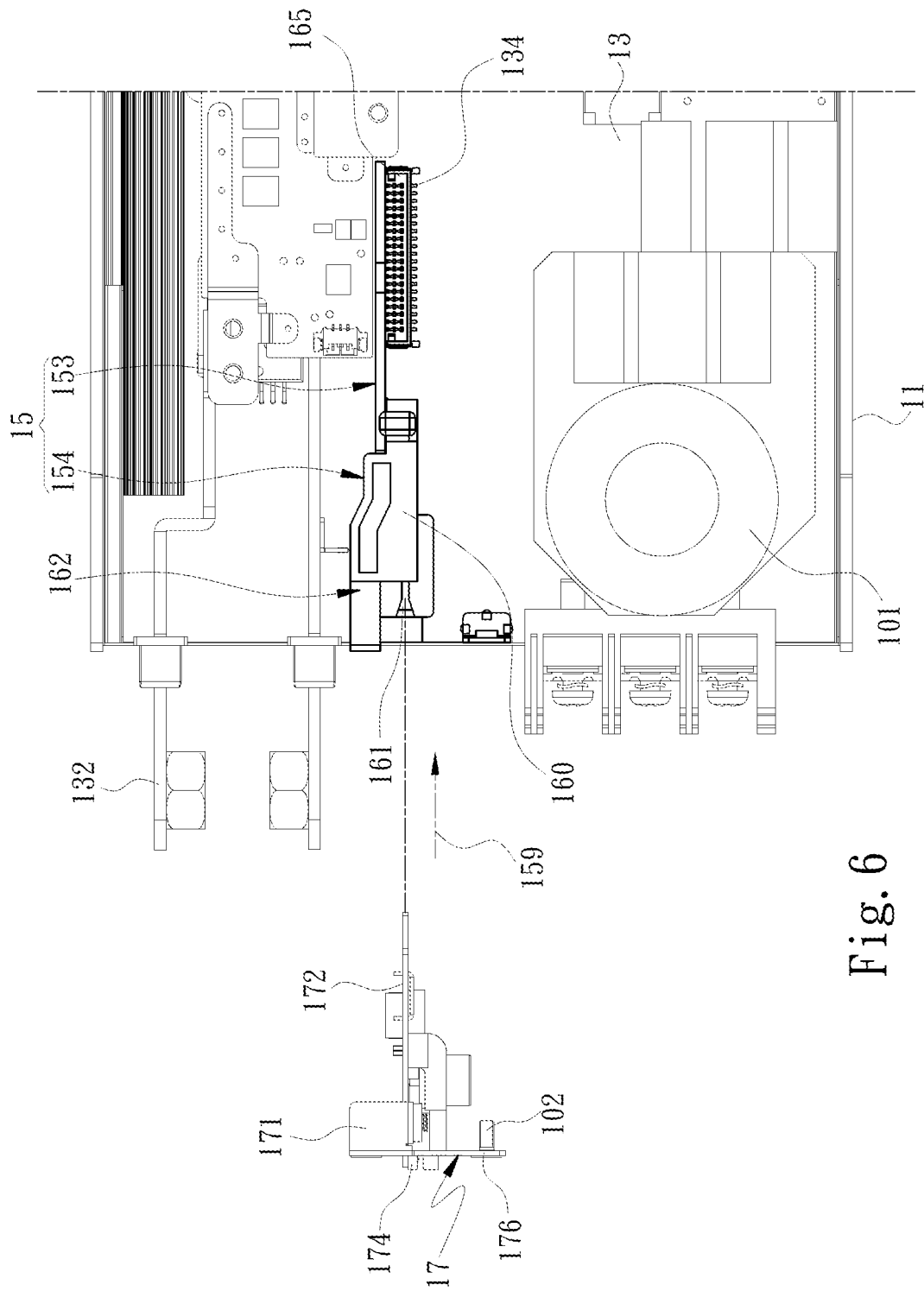
FIG. 6 is a second top view of a cross-sectional structure of an embodiment of the invention.
Figure 7:
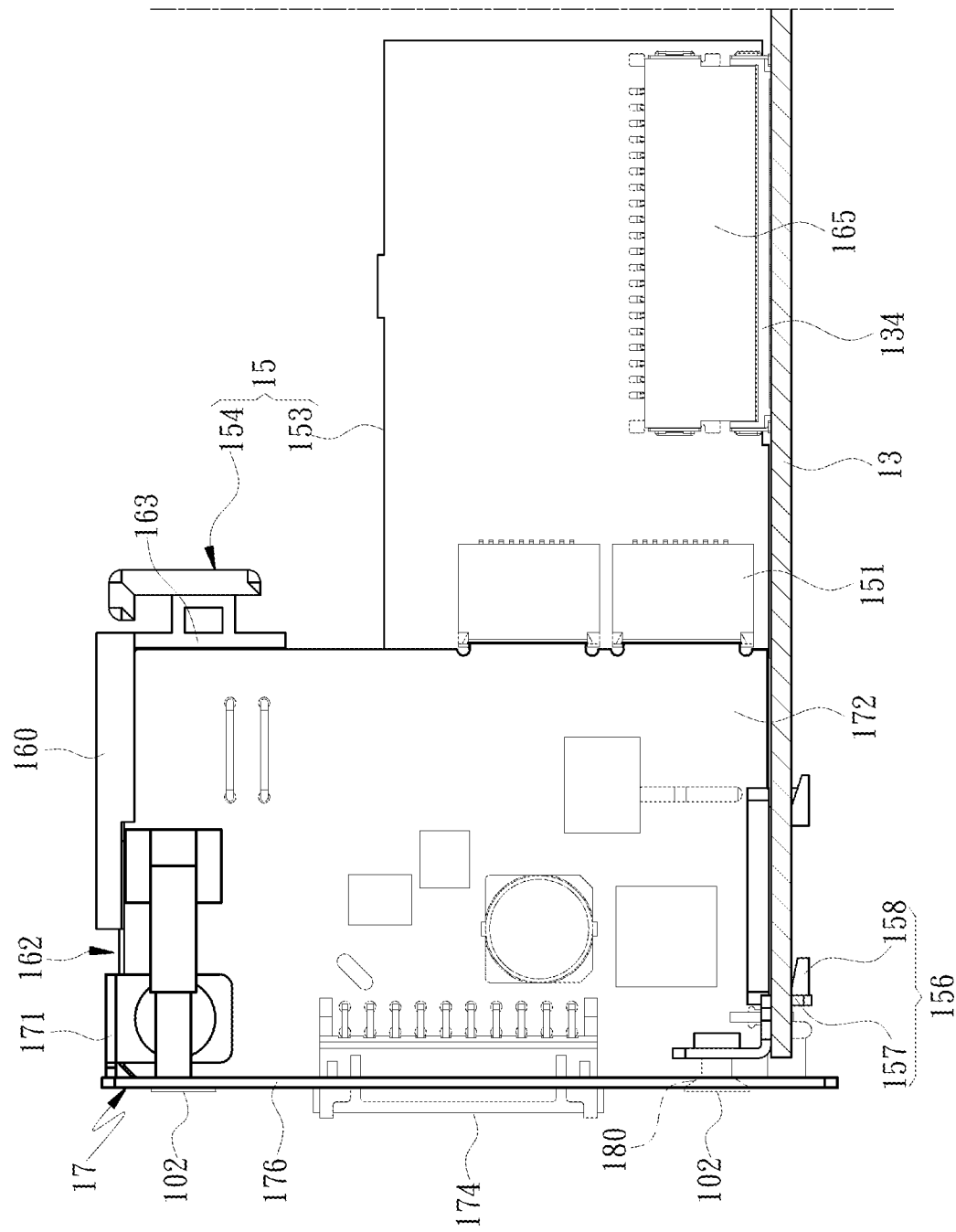
FIG. 7 is a side view of a partial structure of an embodiment of the invention.

The detailed description and technical content of the invention are described below with reference to the accompanying drawings.

Please refer to FIG. 1, FIG. 2, FIG. 3, FIG. 4 and FIG. 5, the invention provides a power supply 10, and the power supply 10 comprises a casing 11, a main board 13, a sub-board 15 and a communication module 17. The casing 11 is used to protect a plurality of electronic components 101 inside the power supply 10, and the casing 11 comprises a port 111. Wherein, the port 111 is formed by one side plate of the casing 11. The main board 13 is placed in the casing 11 and provided for disposing the electronic components 101. The main board 13 comprises a power conversion circuit electrically connected to the electronic components 101, the power conversion circuit can be a conductive layer of the main board 13, the power conversion circuit receives an electric power from at least one of the electronic components 101 and transmits the electric power to at least another one of electronic components 101. The power conversion circuit comprises at least one electrical connection terminal 132, the electrical connection terminal 132 can be implemented in a form of a connecting pin or a connecting port to be used for receiving or transmitting electric power. In addition, the sub-board 15 is disposed on the main board 13 to electrically connect to the power conversion circuit. The sub-board 15 is provided with at least one first connector 151, a first interface 152 of the first connector 151 directly faces the port 111, the first interface 152 is provided for inserting the communication module 17 so that the communication module 17 is able to electrically connect to the sub-board 15.

Figure 8:
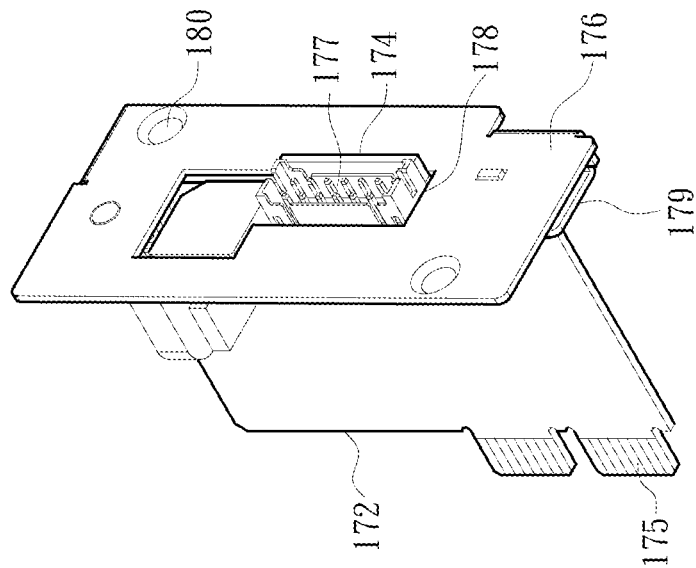
FIG. 8 is a perspective view of a communication module of another embodiment of the invention.
Figure 9:
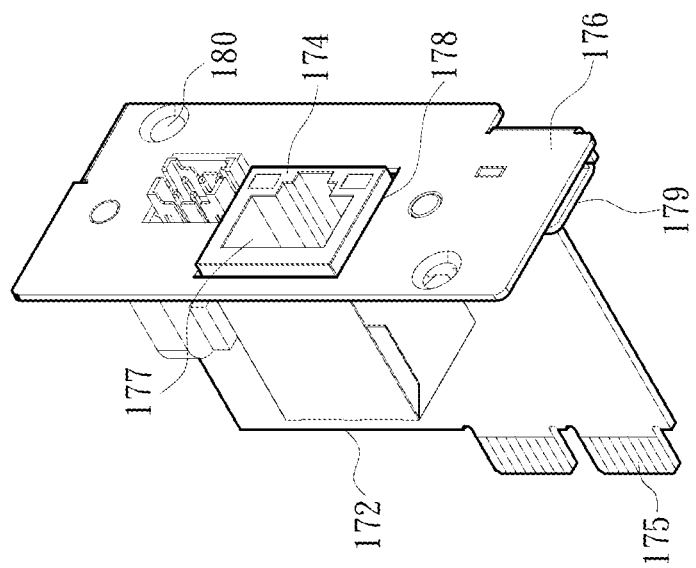
FIG. 9 is a perspective view of the communication module of yet another embodiment of the invention.

The communication module 17 serves as a main part for the power supply 10 to exchange information with at least one external electronic device (not shown in the figures), and the communication module 17 is used to receive on and off signals of the external electronic device (such as a control computer of the power supply 10), and return load signals to the external electronic device. The communication module 17 comprises a first circuit board 172 and a communication circuit provided on the first circuit board 172. The communication circuit comprises a second connector 174 for forming an electrical connection with the external electronic device. In one embodiment, a specification of the second connector 174 is selected from a group consisting of RS-232, RS-422, RS-485, CAN bus, Ethernet, LIN bus, I²C, and USB, as shown in FIG. 8 and FIG. 9. Further, the first circuit board 172 comprises an electrical connection part 175 electrically connected to the communication circuit, and the electrical connection part 175 comprises a first state connecting with the first interface 152, and a second state detaching from the first interface 152.

Implementation of the power supply 10 of the invention will be described in detail hereinafter. It is assumed that the communication module 17 is not inserted into the port 111 and is not connected to the first connector 151 initially. When the communication module 17 is arranged to connect to the first connector 151, the electrical connection part 175 is inserted into the first interface 152 and electrically connected to the first connector 151. At this time, the electrical connection part 175 is in the first state, and the communication module 17 is electrically connected to the power conversion circuit via the sub-board 15 so that information can be exchanged between the main board 13 and the communication module 17. When the electrical connection part 175 is detached from the first interface 152, the electrical connection part 175 turns the first state into the second state, the communication module 17 is no longer electrically connected to the sub-board 15, the communication module 17 is taken out from the port 111, and there is no structural connection between the sub-board 15 and the communication module 17 via physical wires. That is to say, the communication module 17 is completely separated from the sub-board 15 to be regarded as two independent components at this time.

It can be known from the above that by providing the sub-board 15 and the first connector 151 in the power supply 10 of the invention, the electrical connection part 175 is connected to the first interface 152 when the communication module 17 is inserted into the port 111, and the communication module 17 exchanges information with the main board 13 via the sub-board 15. When a user takes out the communication module 17, the electrical connection part 175 is detached from the first interface 152, and the communication module 17 is disconnected from the sub-board 15 to completely separate from the sub-board 15. Therefore, compared with the prior art, the power supply 10 of the invention has a feature that users can replace the communication module 17 by themselves.

Please refer to FIG. 2, FIG. 3, FIG. 4, FIG. 5 and FIG. 6. In one embodiment, the sub-board 15 comprises a second circuit board 153 and a socket 154. The second circuit board 153 is electrically connected to the main board 13 and provided with the first connector 151. In addition, the socket 154 is disposed on one side of the second circuit board 153 and assembled with the second circuit board 153. The socket 154 is used to provide a function of positioning the communication module 17 after the communication module 17 is inserted into the port 111. In one embodiment, both the socket 154 and the second circuit board 153 are located in an extending direction 155, and the socket 154 is capable of directly limiting an assembly position of the communication module 17 when the communication module 17 is displaced relative to the first connector 151.

Further, in order to fix the socket 154, the main board 13 comprises at least one assembling hole 133 disposed at a projection position of the socket 154, and the socket 154 comprises at least one positioning protrusion 156. When the positioning protrusion 156 is assembled in the assembling hole 133, a position of the socket 154 on the main board 13 is fixed, and a situation that the socket 154 is collided to be displaced during assembly process of the communication module 17 is reduced. In one embodiment, the positioning protrusion 156 comprises an upright portion 157 and a hook portion 158 connected to the upright portion 157. During assembly process of the socket 154 with the main board 13, the upright portion 157 is inserted into the assembling hole 133, and the hook portion 158 is disposed to hook on the main board 13, such that a position of the socket 154 is fixed on the main board 13 by the hook portion 158. In addition, the hook portion 158 of the invention also provides an effect of limiting the socket 154 to be assembled in a single direction, thereby reducing interference of the electronic components 101 during assembly of the socket 154.

In addition, please refer to FIG. 2, FIG. 3, FIG. 4, FIG. 5 and FIG. 6, the socket 154 of the invention defines an assembly path 159 for the communication module 17 to be directly plugged into the first connector 151. In more detail, the assembly path 159 is used to limit an assembling direction of the communication module 17 and limit a displacement track of the communication module 17 simultaneously. In this embodiment, the socket 154 comprises two side walls 160 disposed in parallel and two position limiting rails 161 located on the two side walls 160 respectively. The two side walls 160 are respectively located on two opposite sides of the socket 154, when the socket 154 is assembled with the communication module 17, the two side walls 160 are respectively connected with two ends of the first circuit board 172. The two position limiting rails 161 provide guiding for the first circuit board 172 so that the user can push or pull the communication module 17 relative to the socket 154 during assembly or disassembly of the communication module 17. In one embodiment, the socket 154 is formed with the positioning protrusion 156 with one of the two side walls 160.

In addition, in order to limit an assembly position of the communication module 17 in the invention, one of the two side walls 160 is formed with a gap 162 at a side close to the port 111, and the gap 162 is provided for inserting a positioning plate 171 of the communication module 17. Furthermore, in order to assist in limiting the communication module 17, in one embodiment, the socket 154 comprises a retaining wall 163 disposed on a side facing the second circuit board 153 and connected to the two side walls 160. The retaining wall 163 limits an assembly position of the first circuit board 172. In addition, the retaining wall 163 is formed with a through hole 164 for assembling the second circuit board 153 so that the second circuit board 153 is stably assembled with the socket 154 by disposal of the through hole 164.

In one embodiment, the electrical connection part 175 can be a plurality of conductive terminals which are commonly called connecting fingers by those having ordinary skill in the art. In addition, the communication module 17 comprises a covering plate 176 connected to the first circuit board 172, the covering plate 176 is disposed at the port 111 and formed with an opening 178 exposed on a surface and communicated to a second interface 177 of the second connector 174, the external electronic device is connected to the second interface 177 through the opening 178 so that the external electronic device can exchange information with the power supply 10. In one embodiment of the invention, in order to assist in positioning the communication module 17, the covering plate 176 comprises an auxiliary positioning plate 179 facing the main board 13 and the socket 154, the auxiliary positioning plate 179 and the positioning plate 171 are respectively located on two opposite sides of the covering plate 176 to position two ends of the covering plate 176. Furthermore, please refer to FIG. 2, FIG. 3, FIG. 4, FIG. 5, FIG. 6 and FIG. 7. In another embodiment, the covering plate 176 is formed with at least one assembly hole 180 which faces the socket 154 or the casing 11, and the least one assembly hole 180 is assembled with a fixing member 102 to fix an assembly position of the covering plate 176.

On the other hand, in the invention, in order to reduce physical wires inside the power supply 10, the main board 13 and the sub-board 15 are not connected by electric wires, the main board 13 comprises a third connector 134, the sub-board 15 comprises a fourth connector 165, the third connector 134 is electrically connected to the power conversion circuit, the fourth connector 165 is electrically connected to the first connector 151 and assembled with the third connector 134. Accordingly, the sub-board 15 is capable of providing signal transmission between the communication module 17 and the main board 13 via the fourth connector 165.

What is claimed is:

1. A power supply with a replaceable communication module, comprising:
   a casing, comprising a port;
   a main board, disposed in the casing and provided with a power conversion circuit, the power conversion circuit comprising at least one electrical connection terminal, wherein the main board comprises at least one assembling hole;
   a sub-board, disposed on the main board, the sub-board comprising at least one first connector and a second circuit board, wherein the second circuit board is provided with the at least one first connector on one side and is electrically connected with the power conversion circuit of the main board, a first interface of each of the at least one first connector directly facing the port, wherein the sub-board further comprises
   a socket disposed on the side of the second circuit board with the at least one first connector, and the socket and the second circuit board are arranged in an extending direction, and wherein the socket comprises at least one positioning protrusion, two side walls disposed in parallel, two position limiting rails respectively located on the two side walls, and a retaining wall, and wherein the retaining wall is disposed on a side of the socket facing the second circuit board, and the two side walls are respectively located on two opposite sides of the socket without the retaining wall and connected to the retaining wall, and the at least one positioning protrusion is formed on one of the two side walls and assembled in the at least one assembling hole of the main board; and
   the replaceable communication module, receiving on and off signals of at least one external electronic device to exchange information therewith, and the replaceable communication module comprising a first circuit board and a communication circuit disposed on the first circuit board, the communication circuit comprising a second connector for forming an electrical connection with the at least one external electronic device, the first circuit board comprising an electrical connection part electrically connected to the communication circuit, wherein the replaceable communication module is assembled in the socket, and two sides of the first circuit board are respectively connected with the two side walls, an assembly position of the first circuit board in the socket is limited by the retaining wall, and the first circuit board is guided by the two position limiting rails so that the replaceable communication module is displaced relative to the socket to form a first state and a second state of the electrical connection part, wherein in the first state, the electrical connection part connects with the first interface, and the replaceable communication module is electrically connected to the power conversion circuit via the sub-board, and in the second state, the electrical connection part detaches from the first interface, and the replaceable communication module is separated from the sub-board and electrically disconnected from the sub-board.

2. The power supply as claimed in claim 1, wherein the positioning protrusion comprises an upright portion and a hook portion connected to the upright portion.

3. The power supply as claimed in claim 1, wherein the socket defines an assembly path for the replaceable communication module to be directly plugged into the at least one first connector.

4. The power supply as claimed in claim 1, wherein the socket comprising two side walls disposed in parallel, and one of the two side walls is formed with a gap at a side close to the port for inserting a positioning plate of the replaceable communication module.

5. The power supply as claimed in claim 1, wherein the electrical connection part is a plurality of conductive terminals.

6. The power supply as claimed in claim 1, wherein a specification of the second connector is selected from a group consisting of RS-232, RS-422, RS-485, CAN bus, Ethernet, LIN bus, I²C, and USB.

7. The power supply as claimed in claim 6, wherein the replaceable communication module comprising a covering plate connected to the first circuit board and disposed at the port, and the covering plate is formed with an opening exposed on a surface and communicated to a second interface of the second connector.

8. The power supply as claimed in claim 7, wherein the covering plate comprising a positioning plate connected to the sub-board for positioning an assembly position of the replaceable communication module.

9. The power supply as claimed in claim 8, wherein the main board comprising a third connector electrically connected to the power conversion circuit, and the sub-board comprising a fourth connector connected to the third connector.

10. The power supply as claimed in claim 1, wherein the replaceable communication module comprising a covering plate connected to the first circuit board and disposed at the port, and the covering plate is formed with an opening exposed on a surface and communicated to a second interface of the second connector.

11. The power supply as claimed in claim 10, wherein the covering plate comprising a positioning plate connected to the sub-board for positioning an assembly position of the replaceable communication module.

12. The power supply as claimed in claim 11, wherein the main board comprising a third connector electrically connected to the power conversion circuit, and the sub-board comprising a fourth connector connected to the third connector.

13. The power supply as claimed in claim 1, wherein the main board comprising a third connector electrically connected to the power conversion circuit, and the sub-board comprising a fourth connector connected to the third connector.

* * * * *